(12) United States Patent
Schilling et al.

(10) Patent No.: US 7,667,947 B2
(45) Date of Patent: Feb. 23, 2010

(54) OPERATING CONTROL COMPRISING A CAPACITIVE SENSOR ELEMENT AND AN ELECTRICAL DEVICE COMPRISING AN OPERATING CONTROL OF THIS TYPE

(75) Inventors: Wilfried Schilling, Kraichtal (DE); Ralf Dorwarth, Oberderdingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 218 days.

(21) Appl. No.: 11/456,749

(22) Filed: Jul. 11, 2006

(65) Prior Publication Data
US 2006/0243462 A1 Nov. 2, 2006

Related U.S. Application Data

(63) Continuation of application No. PCT/EP2005/000186, filed on Jan. 12, 2005.

(30) Foreign Application Priority Data

Jan. 12, 2004 (DE) .................. 10 2004 002 825

(51) Int. Cl.
*H01G 7/00* (2006.01)
*H01G 5/00* (2006.01)
(52) U.S. Cl. .................. 361/290; 361/277; 361/287
(58) Field of Classification Search .................. 361/277, 361/279, 288, 287, 290, 291
See application file for complete search history.

(56) References Cited

U.S. PATENT DOCUMENTS

| 3,643,041 | A | | 2/1972 | Jackson |
| 3,732,389 | A | * | 5/1973 | Kaelin et al. .................. 200/313 |
| 4,090,092 | A | * | 5/1978 | Serrano ....................... 200/600 |
| 4,158,216 | A | | 6/1979 | Bigelow |
| 4,228,330 | A | | 10/1980 | Larson |
| 4,359,720 | A | | 11/1982 | Chai et al. |
| 4,876,461 | A | | 10/1989 | Gratke |
| 5,155,338 | A | * | 10/1992 | Hoffmann .................. 219/445.1 |
| 5,572,205 | A | * | 11/1996 | Caldwell et al. .............. 341/33 |
| 5,719,740 | A | * | 2/1998 | Hayashi et al. .......... 361/283.4 |

(Continued)

FOREIGN PATENT DOCUMENTS

CN 1328331 A 12/2001

(Continued)

OTHER PUBLICATIONS

International Search Report from PCT/EP2005/000186 dated Jun. 28, 2005.

(Continued)

*Primary Examiner*—Eric Thomas
*Assistant Examiner*—David M Sinclair
(74) *Attorney, Agent, or Firm*—Alston & Bird LLP

(57) ABSTRACT

An operating control device, such as for an appliance, is disclosed comprising sensor elements with a capacitive sensing function, the elements being located underneath a metallic surface that is used as the operating field. An insulating layer is situated between the elements and the metallic surface. When pressure is applied to the metallic surface the capacitance of the sensor element is altered by capacitive coupling. This alteration of capacitance can be determined by a corresponding evaluation circuit or the like for detecting activation of the device.

22 Claims, 2 Drawing Sheets

U.S. PATENT DOCUMENTS

| | | | |
|---|---|---|---|
| 5,721,666 A * | 2/1998 | Girard | 361/627 |
| 5,856,646 A | 1/1999 | Simon | |
| 5,869,791 A * | 2/1999 | Young | 178/20.01 |
| 5,917,165 A | 6/1999 | Platt et al. | |
| 5,923,522 A | 7/1999 | Sajna | |
| 6,137,072 A * | 10/2000 | Martter et al. | 200/512 |
| 6,376,809 B1 * | 4/2002 | Huber et al. | 219/445.1 |

FOREIGN PATENT DOCUMENTS

| | | |
|---|---|---|
| EP | 0 225 748 A2 | 6/1987 |
| GB | 2022872 A | 12/1979 |
| WO | WO 86/06544 | 11/1986 |

OTHER PUBLICATIONS

German Search Report for German Application No. 10 2004 002 825.7, dated Oct. 14, 2004.

T. Wagner, 6.1. Thin Film Science, Retrieved from Internet Site http://www.max-planck.de/pdf/europeanWhiteBook/wb_materials_196_200.pdf, MAX-Planck Institut für Metallforschung Stuttgart, Germany.

Wikipedia, Micrometre, Retrieved Mar. 12, 2009 from Internet Site http://en.wikipedia.org/wiki/Micrometre, 2 pages total, Wikipedia.

Wikipedia, Aluminium Foil, Retrieved Mar. 12, 2009 from Internet Site http://en.wikipedia.org/wiki/Aluminium_foil, 6 pages total, Wikipedia.

Wikipedia, Thin Film, Retrieved Mar. 12, 2009 from Internet Site http://en.wikipedia.org/wiki/Thin_film, 5 pages total, Wikipedia.

Office Action for Chinese Application No. 200580002218 dated Sep. 18, 2009.

* cited by examiner

OPERATING CONTROL COMPRISING A CAPACITIVE SENSOR ELEMENT AND AN ELECTRICAL DEVICE COMPRISING AN OPERATING CONTROL OF THIS TYPE

CROSS REFERENCE TO RELATED APPLICATIONS

This application claims priority from PCT application no. PCT/EP2005/000186, filed Jan. 12, 2005, which is based on German Application No. 102004002825.7, which was filed Jan. 12, 2004, of which the contents of both are hereby incorporated by reference.

BACKGROUND OF INVENTION

The invention generally relates to an operating device for an electrical appliance, as well as to an electrical appliance incorporating such an operating device.

Various types of operating devices for operating electrical appliances that are actuated by placing a finger or exerting a slight pressure with a finger are known. For example, EP 859 467 A and EP 859 468 A disclose an operating principle in which a capacitance change can be brought about in a capacitive sensor element, without exerting a significant pressure or a covered operating path. This can be evaluated as an actuation.

It is also known from DE 198 11 372 A to place beneath a panel of an electrical appliance on the metal frame of a glass ceramic cooking hob or electrical cooktop, a switch having a piezoelectric element. If a finger is placed on the panel area and a certain pressure exerted, said pressure can be detected by the piezoelectric element and evaluated as an actuation. However, the use of piezoelectric elements may be disadvantageous in that piezoelectric elements are relatively expensive and in part mechanically sensitive.

BRIEF DESCRIPTION OF THE DRAWINGS

Embodiments of the invention are described in greater detail hereinafter and the attached drawings, wherein.

DETAILED DESCRIPTION OF THE EMBODIMENTS

Figure 1:
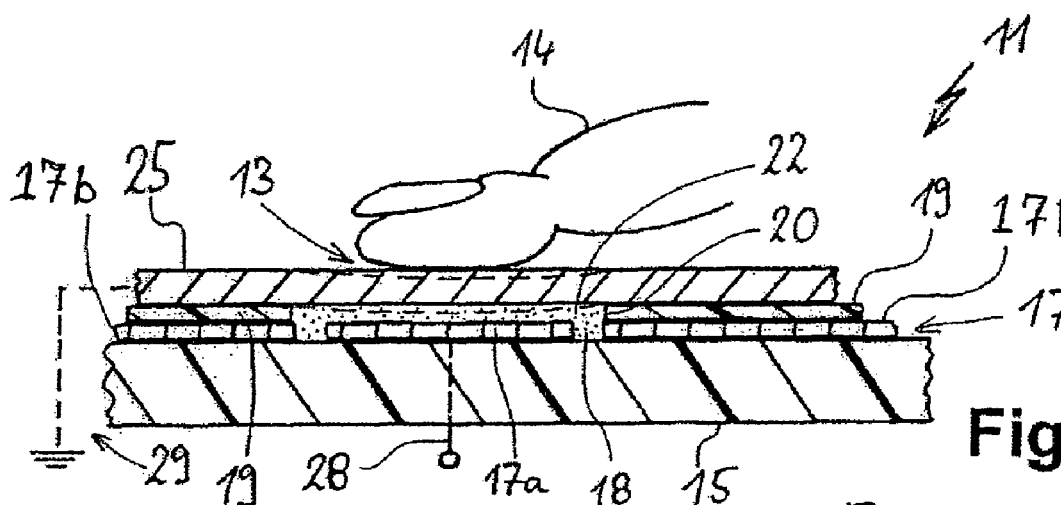
FIG. 1 illustrates a section through a sandwich structure of an operating device according to the invention.

One problem to be solved by the invention is to provide an aforementioned operating device and an electrical appliance equipped with such an operating device making it possible to avoid the prior art shortcomings and in particular so as to increase the range of uses of capacitive sensor elements, whilst simultaneously achieving robustness and reliability in daily use.

This problem is solved by an operating device and an electrical appliance having the features as claimed herein. Advantageous and preferred developments of the invention form the subject matter of further claims and are explained in greater detail hereinafter. By express reference the wording of the claims is made into part of the content of the description.

According to one embodiment of the invention, the operating device has a variable-shaped or elastic operating field, which typically is a planar surface of a material that can be slightly deformed by a pressing action onto an area, which can be accomplished by the application of a finger with pressure thereto. The pressure triggering the operation is in the form of a force of a few Newtons. Under the operating field is a capacitive, preferably flat sensor element in the form of an electrically conductive, lower sensor surface. The latter forms a capacitor plate of the capacitive sensor element. Between the operating field and sensor element/sensor surface is a dielectric layer. The operating field is metallic or otherwise electrically conductive on the outside or top. If in the aforementioned manner, pressure is exerted on the operating field, the latter approaches the lower sensor surface, and the dielectric layer becomes thinner and causing a capacitance change on the sensor element. This capacitance change from an initial specific value is monitored by a corresponding evaluation circuitry. The capacitance change generally corresponds to a specific applied pressure causing a specific change of the operating field, which is detected as the user's operation of the appliance.

An advantage of the invention is that a capacitive sensor element with the advantages of its control and evaluation can also be provided with a metallic surface of the associated operating field. It is in particular possible to integrate this into a larger metallic surface, whereof a non-separated area, which can be optically marked, is used as the operating field. It is in particular also possible to provide several different sensor elements or operating fields beneath a through metallic surface, without there being mutual influencing or interference between the sensor elements.

The operating field or the material from which the sensor is made can be electrically conductive throughout. It is preferably constituted by a single material layer. If it is constructed in uninterrupted manner in the vicinity of the operating device or the one or more operating fields, it is possible to create an easily cleaned and relatively insensitive surface for the operating device. It is possible to construct an operating field from thin metal, for example having a metal foil with a thickness of less than 1 mm and in particular as thin as 100 µm. The material can be constituted by various metal alloys having an adequate elasticity for the indicated requirements. It is in particular possible to use high-grade steel or a chromium-plated metal which, as a result of their characteristics in connection with corrosion resistance, offer important advantages.

The dielectric layer can be constructed in numerous different ways. The capacitance, as an absolute value on the sensor element, can be influenced by means of the associated dielectric constant. The main requirement made on the dielectric is compressibility as a result of the aforementioned, advantageous actuating force. It is also possible to use air as the dielectric layer. For this purpose, a certain spacing is advantageously left between the sensor surface or element and the operating field. The dielectric layer can be thinner than 1 mm and is preferably as thin as 100 µm.

In a preferred embodiment of the invention, there are several sensor elements each having a sensor surface and operating fields over the same, as well as dielectric layers between the same, which are juxtaposed and have a certain mutual spacing. A simplification can be brought about if the operating fields are made from a material, particularly flat material, which is used throughout, such as a metal plate or foil. Advantageously, there are no openings, so that the surface is water-tight and can be easily cleaned. Interruptions, recesses, etc., in order to achieve the limited thickness for elasticity for compression purposes, are preferably provided on the underside, i.e. towards the sensor elements.

A sensor surface can be surrounded at a certain distance, particularly a few millimeters, by a conductive surface, which forms a grounding surface. In the case of an operating device with several juxtaposed sensor elements, it is advantageous to provide a common, electrically connected or continuous grounding surface. During the manufacturing process, this surface can be formed from the same metal layer as the sensor surface faces and electrical separation is brought about by appropriate structure. In certain circumstances, a spacing layer can be provided in order to separate the sensor surface and any possible grounding surface from an electrically conductive underside of the operating fields, as well as to create space between the sensor surface and operating field for the dielectric layer. The latter should comprise insulating flat material, which can also be applied as a workable layer. Recesses can be provided in the vicinity of the sensor surfaces, so as to form the air dielectric layer. It is alternatively possible to form the spacing layer from a material having a suitable dielectric constant and appropriate thickness, which is then located between the sensor surface and operating field and which must be adequately compressible.

According to a further development of the invention, the operating field can be made from a flat material or cover, which is considerably larger than the operating field. This makes it possible to construct an operating device, such as an electrical appliance, with one or more sensor elements and therefore also one or more operating fields in a cover or side wall. Thus, an operating device constructed in this way can be integrated into such a wall and, in particular, also into an electrical appliance. It is possible make the cover or its material thinner in the vicinity of the operating field than in other areas. To this end, it is possible to make material recesses on the underside by material-removing methods or by deforming methods, such as punching or stamping. Thus, a wall which offers a hold or protection can be made thinner in certain zones or areas, in order to locate the operating fields of an operating device. One possibility for such a cover is a panel of an electrical appliance, for example a front panel or frame.

An electrical appliance according to the invention has at least one operating device, which corresponds to one of the above-described constructions. For this purpose, the electrical appliance advantageously has an operating area, at which the operating device is located with the one or more operating fields. For example, the electrical appliance can be a cooktop or stove with a side part, which on at least one side can be in the form of a panel or an all-round frame. The operating device is integrated into said side part or frame, for example with sensor elements located beneath the side part or frame.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and also the subheadings in no way restrict the general validity of the statements made thereunder.

FIG. 1 diagrammatically shows in section an operating device 11 having an operating field 13 on which is placed a finger 14 exerting a slight pressure for operation or triggering an operation. On the top surface of the metal surface 25 near the operating field 13, optically detectable markings (e.g., indicia) such as inscriptions, impressions, etc may be indicated. There can also be a corresponding surface structuring, for example using symbols by means of depressions or elevations.

The operating device 11 has a sandwich structure, which will be explained hereinafter. A metal coating 17 is applied to a printed circuit board 15 as a support. The metal coating 17 is subdivided into sensor elements 17a, whose flat shape with connection can be seen in the plan view of FIG. 2 and which form the aforementioned sensor surfaces. In place of a square shaping of the sensor elements 17a, it is obviously also possible to use round, oval and elongated shapes. The sensor elements 17a are worked out of the metal coating 17 through frame cutouts 18, whose corresponding structure is also visible in FIG. 2. The surrounding metal surface 17b forms a type of grounding surface. The metal coating 17 can for example be applied as a copper coating using conventional methods to the circuit board 15. Structuring the shapes can also take place in known manner.

To the metal coating 17 is applied an insulating layer 19 with recesses 20, which correspond in shape to the sensor elements 17a, but are somewhat larger so as to surround the sensor elements like the frame cutouts 18. The insulating layer 19 can be a plastic film, for example a polyester film. It can be self-adhesive on one or both sides so as to make it easier to produce the structure.

A metal surface 25 is applied to the insulating layer 19 and can be constituted by a high-grade steel foil, a thin high-grade steel plate, etc., which more particularly when the surface is exposed so as to form the operating field 13, can be cleaned and cared for in an advantageous, practical manner.

At least in the vicinity of operating device 11 or operating fields 13, the metal surface 25 has a uniform thickness throughout. In alternative constructions, a thicker metal layer or plate can be used and is thinned out over the operating fields 13.

A gap, filled with an air layer 22, is formed between metal foil 25 and sensor element 17a and is represented as an air filling by dotted lines. The air layer 22 forms a dielectric between the metallic operating field 13 and sensor element 17a and its function will be described in greater detail hereinafter. In place of an air layer 22 as the dielectric, it is also possible to use some other dielectric, provided that it is compressible or can be compressed in order to bring the operating field 13 closer to the sensor element 17a. This sag of the operating field 13 is illustrated in the vicinity of finger 14 by the downwardly curved broken line.

Figure 2:
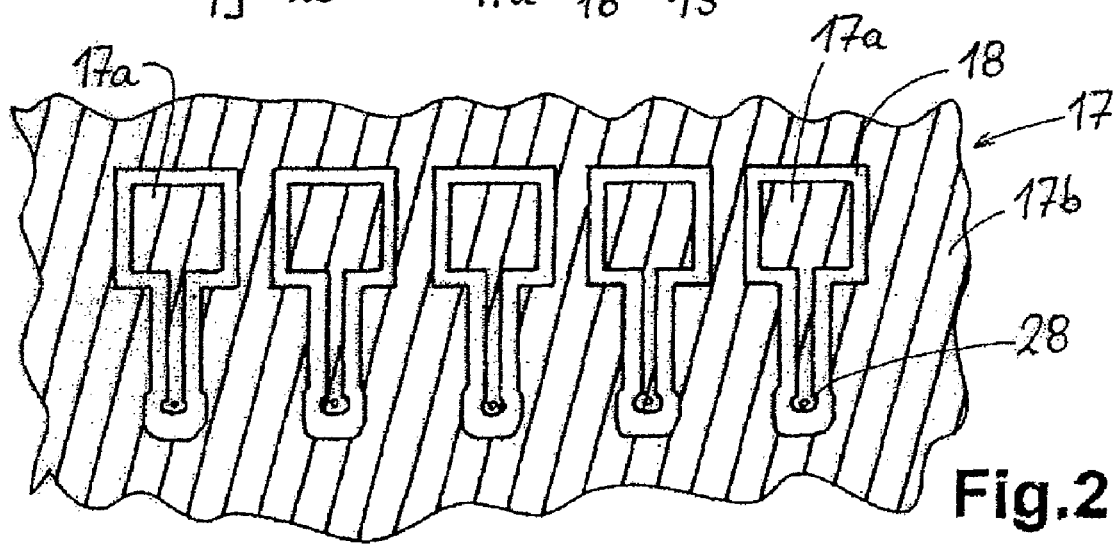
FIG. 2 illustrates a plan view of a layer of the operating device of FIG. 1 with several juxtaposed sensor elements.
Figure 3:
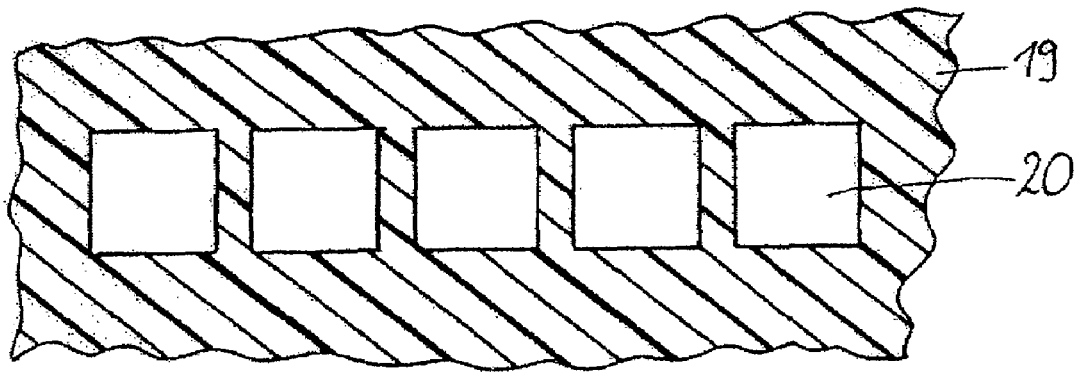
FIG. 3 illustrates a plan view of the insulating layer.

A terminal 28 emanating from the downwardly projecting ends of the sensor elements 17 in FIG. 2 leads to the sensor element 17a, for example for the control circuitry or evaluation circuitry of operating device 11. The metal surface 25, as illustrated in broken line form, can be connected to ground 29. However, this may not be necessary, and if so, then there is only a capacitive coupling to sensor element 17a or the surrounding surface 17b of metal coating 17.

Figure 4:
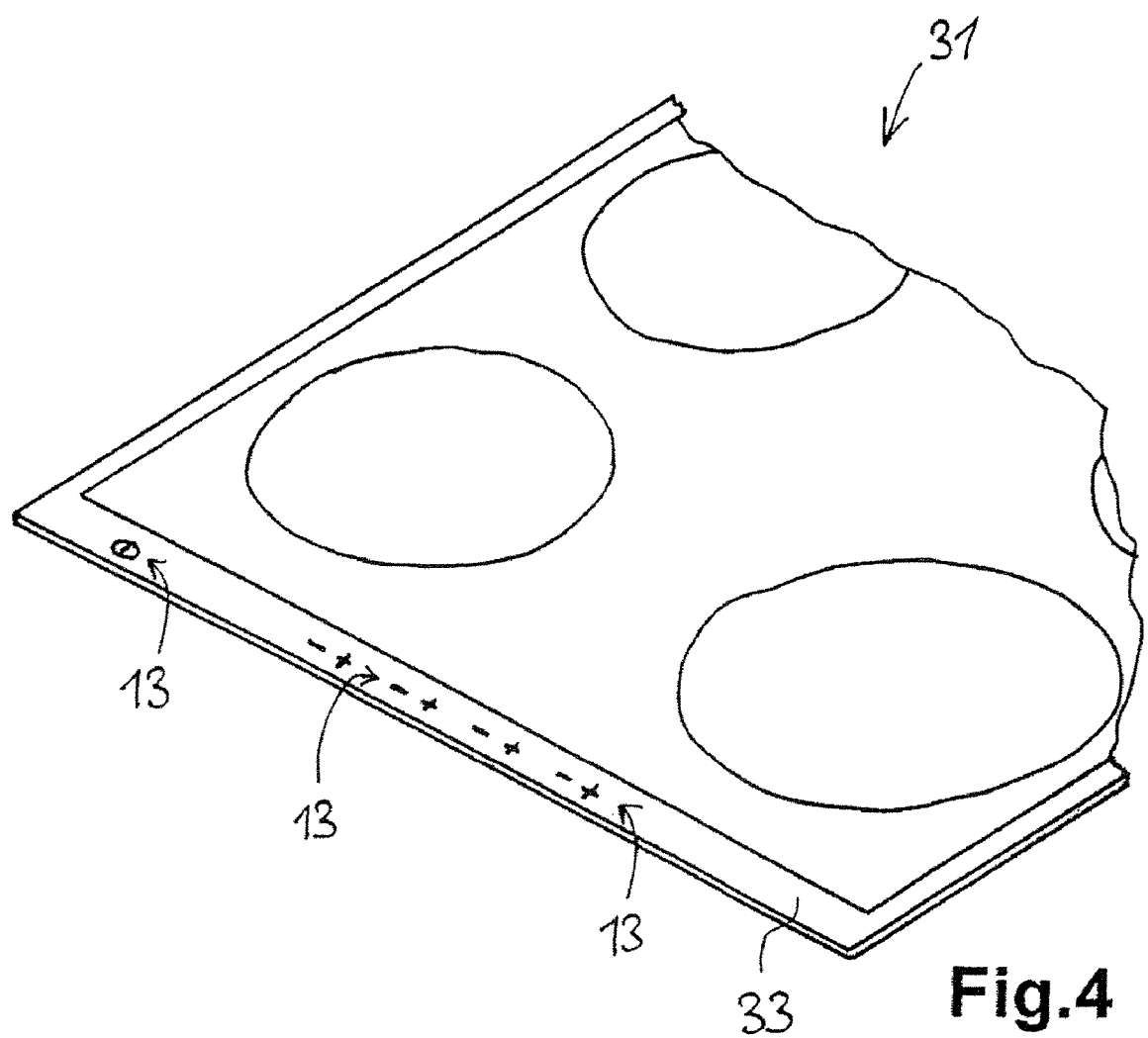
FIG. 4 illustrates an oblique view of a hob, integrated into the frame of an operating device as in FIG. 1.

FIG. 4 shows a cooktop 31, such as those incorporating a glass ceramic heating elements. In conventional manner, the latter has an all-round frame 33, which is constructed on its left-hand, lower side as a front panel directed towards a user. The frame 33 has various operating fields 13, namely to the far left, an ON-OFF switch and in the central area, a power adjusting switch for the individual hotplates and which are diagrammatically represented in circular form. Through pressure on the operating fields 13 it is possible to initiate the associated function for each heating element. In this construction, an operating device similar to that of FIG. 1 is located beneath the frame 33. The surface of the frame 33 can be made from a metal coating, plate or foil throughout and corresponds to the metal surface 25 of FIG. 1. As shown in FIG. 1, the sandwich structure is only provided below the operating fields 13. In the remaining area of the frame 33, the metal can be solidly lined.

Alternatively, the frame can be made from an metallic flat material that is several millimeters thick. The material may be thinned out from below in the vicinity of operating fields 13 and an associated operating device of FIG. 1 can be housed underneath in such thinned out areas. As an alternative to thinning out a thicker metal coating from below, there can also be a thinning out from above. In this case a resulting depression could be used as a structuring for a precise application of a finger or the like.

In connection with the dimensions in FIG. 1, it is pointed out that these can be varied. The thicknesses of the individual layers can be varied as advantageous for circuit board 15. The metal coating 17 can be of various thickness, for example approximately 0.1 mm, such as is conventional for copper-coated circuit boards or the like. The insulating layer can also be 0.1 mm thick. The metal surface 25 above it has been used in tests with a thickness of 0.2 mm in the form of a high-grade steel foil and good results have been obtained. The exaggerated sag illustrated by the broken lines in FIG. 1 with respect to the metal surface 25 can be in the μm range, for example 10 μm or less. In the case of a test structure with a 0.2 mm thick high-grade steel foil as metal foil 25, a weight of 230 grams gave rise to a sag such that it was possible to detect a capacitance change of 18% on sensor element 17a. The surface of a sensor element 17a or operating field is advantageously approximately 1 to 3 cm per side. This leads to a relatively well defined application surface, together with the resulting sag, on applying a finger 14.

Function

Fundamentally, the operating device 11 according to the invention is based on the evaluation of a capacitive sensor element 17a, a capacitance change resulting from the operation. An example of an evaluating circuit for such capacitive sensor elements, but in the case of a somewhat differently constructed sensor element, is known from EP 859 468 A. This evaluating circuit can also be used here in principle.

Due to the compressive force on applying a finger 14 to operating field 13, there is a certain sagging or deformation of the latter or of the associated metal surface 25. This modifies the spacing between sensor element 17a, which functionally represents a capacitor surface, and the metal surface 25 above it. This leads to a clear capacitance change on sensor element 17a and said change can be detected and evaluated by the associated circuitry. As a result of the interposed dielectric 22, the effect can be intensified by increasing the capacitance and in this way detection of the change is improved.

Another advantage of determining the capacitance change as a relative change and not only as the absolute quantity, is avoiding false detections resulting as a function of any time-based downward sagging of the metal surface 25 and the resulting change to the absolute capacitance.

Thus, the invention creates an operating device, which has a capacitive sensor element or capacitive operating principle. It is simultaneously possible to use particularly high-grade steel surfaces combined therewith on the operating fields for the operating device metal surfaces. These are particularly advantageous for practical reasons as such steel surfaces occur in numerous electrical appliances, particularly domestic appliances. Only a slight pressure with the finger is needed for operating purposes. In addition, very short operating paths are sufficient, but would not be sufficient as the switching path for mechanical switches.

The invention claimed is:

1. An operating device for an electrical appliance having an operating field capable of varying shape, having a capacitive sensor element below said operating field, wherein operation occurs by applying pressure on said operating field, said sensor element having an electrically conductive, lower sensor surface as a capacitor plate, wherein said operating field is above said lower sensor surface and a dielectric layer is located between said operating field and said sensor surface, wherein said operating field is electrically conductive at least on its outside and formed by a flat material forming a cover being larger than said operating field and extending beyond said operating field and said cover is of a thinner thickness in the vicinity of said operating field, and wherein the application of the pressure onto said outside of said operating field causes the operating field to approach said lower sensor surface thereby effecting a change in capacitance at the capacitive sensor element.

2. The operating device according to claim 1, wherein said operating field is electrically conductive.

3. The operating device according to claim 1, wherein said operating field is a single metallic layer.

4. The operating device according to claim 1, wherein said operating field is an uninterrupted planar surface in the vicinity of said operating field.

5. The operating device according to claim 1, wherein said operating field is made from a metal sheet having a thickness of less than 1 millimeter.

6. The operating device according to claim 1, wherein said dielectric layer comprises air.

7. The operating device according to claim 6, wherein said dielectric layer is an air layer.

8. The operating device according to claim 1, wherein said dielectric layer is thinner than 1 millimeter.

9. The operating device according to claim 1, wherein said operating field is thinner than 1 millimeter.

10. The operating device according to claim 1, wherein one of said operating field and a plurality of said sensor elements are provided, each said sensor element having one said sensor surface and said operating field above said sensor surface and a dielectric layer between each sensor surface and the operating field, wherein said sensor elements are juxtaposed on a planar surface.

11. The operating device according to claim 10, wherein at least one said sensor surface is surrounded by a conductive surface forming a grounding surface with a gap between the conductive surface and the at least one sensor surface.

12. The operating device according to claim 11, wherein said grounding surface is a metal coating.

13. The operating device according to claim 12, wherein each sensor element is placed on a support, wherein said grounding surface surrounds one of said sensor surface, wherein the grounding surface is formed from the same metal coating by structuring.

14. The operating device according to claim 12, wherein a spacing layer is applied to a layer forming said sensor surface and said grounding surface, wherein said spacing layer has at least one recess in a vicinity of said sensor surface, said operating field being located on said spacing layer and said dielectric layer being formed in said at least one recess of said spacing layer through spacing between said sensor surface and said operating field.

15. The operating device according to claim 14, wherein said spacing layer is of flat insulating material.

16. The operating device according to claim 1, wherein an elastic, insulating flat material is placed between said sensor surface and said operating field and is compressed by applying pressure on said operating field.

17. The operating device according to claim 1 wherein the operating field has an outer surface facing a user, the operating field integrally formed as part of a panel or defined by a cutout in the frame of a household cooking appliance.

18. The operating device of claim 17 wherein the outer surface of the operating field bears indicia providing operating instructions to the user.

19. The operative device according to claim 1 wherein the operative device is incorporated into an electrical appliance.

20. The operating device of claim 19 wherein the electrical appliance is an electric cooktop with an all-round frame and wherein said operating device is integrated into said frame and an operating field is formed by said frame.

21. An operating device for an electrical appliance having an operating field capable of varying shape, having a plurality of capacitive sensor elements below said operating field, wherein operation of said operating device is configured to occur by contacting and applying pressure on said operating field, wherein each of said sensor elements has a respective electrically conductive, lower sensor surface as a capacitor plate, wherein said operating field is above said respective lower sensor surface and a dielectric layer is located between said operating field and said respective sensor surface, wherein said operating field is a single electrically conductive metallic layer, wherein the electrically conductive metallic layer comprises a metal foil having a thickness between 100 micrometers and 1 millimeter, without any openings therein positioned over any of the plurality of capacitor sensor elements and comprising a flat material forming a cover being larger than said operating field and extending beyond said operating field, and wherein said operating device is configured such that the application of the pressure onto said operating field by a user's finger causes the operating field to approach but not contact one of said lower sensor surfaces thereby effecting a change in capacitance at the respective capacitive sensor element.

22. An operating device for an electrical appliance having an operating field capable of varying shape, having a plurality of capacitive sensor elements below said operating field, wherein operation occurs by contacting and applying pressure on said operating field by a user's finger, wherein each of said sensor elements has a respective electrically conductive, lower sensor surface as a capacitor plate, wherein said operating field is above said respective lower sensor surface and a dielectric layer is located between said operating field and said respective sensor surface, wherein the electrically conductive metallic layer comprises a metal foil having a thickness greater than 100 micrometers without any openings therein positioned over any of the plurality of capacitor sensor elements and comprising a flat material forming a cover being larger than said operating field and extending beyond said operating field, and wherein said operating device is configured such that the application of the pressure onto said operating field causes the operating field to approach but not contact one of said lower sensor surfaces thereby effecting a change in capacitance at the respective capacitive sensor element.

* * * * *